United States Patent [19]

Fulford, Jr. et al.

[11] Patent Number: 5,759,913
[45] Date of Patent: Jun. 2, 1998

[54] METHOD OF FORMATION OF AN AIR GAP WITHIN A SEMICONDUCTOR DIELECTRIC BY SOLVENT DESORPTION

[75] Inventors: H. Jim Fulford, Jr.; Robert Dawson; Fred N. Hause; Basab Bandyopadhyay. all of Austin; Mark W. Michael. Cedar Park; William S. Brennan. Austin, all of Tex.

[73] Assignee: Advanced Micro Devices, Inc., Sunnyvale, Calif.

[21] Appl. No.: 658,547

[22] Filed: Jun. 5, 1996

[51] Int. Cl.$^6$ .................................. H01L 21/283
[52] U.S. Cl. .................................. 438/624; 438/422
[58] Field of Search .................................. 257/759, 760, 257/790; 148/DIG. 73; 437/187, 192, 195, 228 H, 228 I, 927; 438/624, 422, 355, 338

[56] References Cited

U.S. PATENT DOCUMENTS

| 5,324,683 | 6/1994 | Fitch et al. | 437/927 |
| 5,407,860 | 4/1995 | Stoltz et al. | 437/927 |

FOREIGN PATENT DOCUMENTS

| 63-179548 | 7/1988 | Japan |
| 1-296641 | 11/1989 | Japan |
| 5-206120 | 8/1993 | Japan |

*Primary Examiner*—George R. Fourson
*Attorney, Agent, or Firm*—Kevin L. Daffer; Conley, Rose & Tayon

[57] ABSTRACT

A dielectric material is provided having air gaps which form during dielectric deposition between interconnects. The dielectric is deposited in interconnect-spaced geometries which have certain aspect ratios and which are exposed at the bottom of the geometries to a hygroscopic dielectric. During deposition, the dielectric is forced along the sidewall of the spaced interconnects as a result of moisture ougasing from the hygroscopic dielectric. Over a period of time, a keyhole occurs with pile up accumulation (or cusping) at the corners of the spaced interconnects. By decreasing the deposition temperature in a subsequent step, outgasing is minimized, and deposition over the keyhole and upon the hygroscopic dielectric takes place. Keyhole coverage results in an air gap which is surrounded on all sides by the fill dielectric. Air gap between interconnects helps reduce permittivity of the overall dielectric structure, resulting in a lessening of the interconnect line-to-line capacitance.

17 Claims, 3 Drawing Sheets

where r represents resistivity of the conductive material, and $T_c$, is the interconnect thickness. Combinations of equations 1 and 3, and/or equations 2 and 3 indicate the propagation delay of a conductor as follows:

$$RC_{LS} = reL^2/T_cT_{d1}$$

$$RC_{LL} = reL^2/W_LT_{d2}$$

5,759,913

METHOD OF FORMATION OF AN AIR GAP WITHIN A SEMICONDUCTOR DIELECTRIC BY SOLVENT DESORPTION

BACKGROUND OF THE INVENTION

1. Field of the Invention

This invention relates to semiconductor fabrication and more particularly to a film which desorbs into a dielectric being deposited between semiconductor interconnect lines. Desorption produces an air gap within the dielectric for decreasing permittivity of the dielectric in regions between interconnect.

2. Description of the Relevant Art

An integrated circuit includes numerous conductors extending across the topography of a monolithic substrate. A set of interconnect lines (or conductors) which serve to electrically connect two or more components within a system is generally referred to as a "bus". A collection of voltage levels are forwarded across the conductors to allow proper operation of the components. For example, a microprocessor is connected to memories and input/output devices by certain bus structures. There are numerous types of busses which are classified according to their operation. Examples of well-known types of busses include address busses, data busses and control busses.

Conductors within a bus generally extend parallel to each other across the semiconductor topography. The conductors are isolated from each other and from underlying conductive elements by a dielectric, a suitable dielectric being, for example, silicon dioxide ("oxide"). Conductors are thereby lithography patterned across the semiconductor topography, wherein the topography comprises a substrate with a dielectric placed thereon. The topography can also include one or more layers of conductors which are sealed by an upper layer of dielectric material. Accordingly, the layers of conductors overlaid with a dielectric present a topography upon which a subsequent layer of conductors can be patterned.

Conductors are made from an electrically conductive material, a suitable material includes Al, Ti, Ta, W, Mo, polysilicon, or a combination thereof. Substrate includes any type of material which can retain dopant ions and the isolated conductivity regions brought about by those ions. Typically, substrate is a silicon-based material which receives p-type or n-type ions.

Generally speaking, interconnect lines (or conductors) are fashioned upon the topography and spaced by a dielectric above an underlying conductor or substrate by a dielectric thickness $T_{d1}$. Each conductor is spaced from other conductors by a dielectric within the same level of conductors by a distance $T_{d2}$. Accordingly, conductor-to-substrate capacitance $C_{LS}$ is determined as follows:

$$C_{LS} = eW_LL/T_{d1} \quad \text{(Eq. 1)}$$

Further, the conductor-to-conductor capacitance $C_{LL}$ is determined as follows:

$$C_{LL} = eT_cL/T_{d2} \quad \text{(Eq. 2)}$$

, where e is the permittivity of the dielectric material (the dielectric material between the conductor and substrate or the dielectric material between conductors), $W_L$ is the conductor width, $T_c$ is the conductor thickness, and L is the conductor length. Resistance of the conductor is calculated as follows:

$$R = (rL)/W_LT_c \quad \text{(Eq. 3)}$$

Propagation delay is an important characteristic of an integrated circuit since it limits the speed (frequency) at which the circuit or circuits can operate. The shorter the propagation delay, the higher the speed of the circuit or circuits. It is therefore important that propagation delay be minimized as much as possible given the geometric constraints of the semiconductor topography.

Propagation delay is shown to be a function of both line-to-substrate capacitance $C_{LS}$ as well as line-to-line capacitance $C_{LL}$. Accordingly, propagation delay is determined by parasitic capacitance values between conductors ($C_{LL}$), and parasitic capacitance values between each conductor and substrate ($C_{LS}$). As circuit density increases, spacing between conductors decrease and capacitance $C_{LL}$ becomes predominant relative to $C_{LS}$. In other words, line-to-line capacitance $C_{LL}$ increases with decreasing spacing between conductors. FIG. 1 illustrates the effect of line-to-line spacing on $C_{LL}$. As spacing decreases, $C_{LL}$ is shown to increase dramatically as compared to $C_{LS}$. Modern integrated circuits which employ narrow interconnect spacings thereby define $C_{LL}$ as the primary parasitic capacitance rather than $C_{LS}$.

Increases in $C_{LL}$ pose two major problems. First, an increase in $C_{LL}$ generally causes an increase in the time at which a transition on the one end of the conductor occurs at the end. Increase in transition time (i.e., increase in speed degradation) thereby requires a longer drive period. If the conductor extends along a critical speed path, speed degradation on the line will jeopardize functionality of the overall circuit. Second, a larger $C_{LL}$ causes an increase in crosstalk noise. A conductor which does not transition, nonetheless receives crosstalk noise from neighboring lines which do.

It is thereby important to minimize propagation delay especially in critical speed path. Given the constraints of chemical compositions, it is not readily plausible to reduce the resistivity r of conductor materials. Geometric constraints make it difficult to increase conductor thickness $T_c$ or dielectric thickness $T_{d1}$ or $T_{d2}$. Still further, instead of reducing length L of a conductor, most modern integrated circuits employ longer interconnect lines which compound the propagation delay problems. Accordingly, a need arises for instituting a reduction in propagation delay but within the chemical and geometric constraints of existing fabrication processes. It is therefore desirable that a fabrication process be derived which can reduce propagation by reducing the permittivity e of dielectric material. More specifically, the desired process must be one which reduces permittivity of dielectric material between conductors since the line-to-line capacitance appears a more predominant factor than the line-to-substrate capacitance. As such, it would be desirable to employ a fabrication technique in which dielectrics between conductors achieve low permittivity.

SUMMARY OF THE INVENTION

The problems outlined above are in large part solved by a fabrication process which produces a low permittivity dielectric between interconnect lines. The process utilizes a deposition technique which purposely allows formation of an air gap within a dielectric. The air gap is formed at approximately a midline between specific interconnect lines. Permittivity of air within the air gap is less than that of the surrounding dielectric material, such as oxide, nitride, oxynitride, etc. Presence of an air gap within the dielectric causes an overall decrease in permittivity between interconnects. Reduction in permittivity results in a lessening of the line-to-line capacitance $C_{LL}$. Reduction in $C_{LL}$ is shown above to cause corresponding reduction in propagation delay $RC_{LL}$. Incorporation of an air gap thereby reduces propagation delay and proves beneficial in meeting speed requirements within critical path interconnect lines, possibly interconnect lines spaced adjacent to each other within a bus structure.

The air gap is formed by paying close attention to the geometry between interconnect lines. If the aspect ratio of dielectric fill height is greater than spacing width between interconnects, there is a greater likelihood that an air gap will be formed during the deposition cycle. Aspect ratio is maintained by configuring the height of fill areas to be greater than interconnect thickness. More specifically, the height is a combination of interconnect and underlying dielectric thickness. By removing portions of the underlying dielectric between interconnect, aspect ratio in those areas is increased.

Air gap formation is maintained and enhanced by allowing outgas from an underlying hygroscopic dielectric into the fill dielectric deposited between the spaced interconnects. Outgassing also occurs as vapors or gases are emitted during a partial thermal decomposition of the dielectric. Outgassing is shown to at least partially if not entirely occur during the deposition of the fill dielectric, causing a keyhole to form within the dielectric. A subsequent deposition step under thermal conditions different than the original deposition conditions may be necessary to cap the keyhole and form an air gap. The capping dielectric therefore differs in fill characteristics from the fill dielectric.

Broadly speaking, the present invention contemplates a method for forming a dielectric material between a pair of integrated circuit interconnects. The method includes the steps of providing a semiconductor topography, and then depositing a sandwich structure upon a semiconductor topography. The sandwich structure comprises a layer of hygroscopic dielectric interposed between a pair of dielectric layers which are substantially non-hygroscopic. A conductive layer is then deposited upon the sandwich structure. The conductive layer, one of the pair of dielectric layers, and at least a portion of the hygroscopic dielectric is then removed in select regions across the semiconductor topography to form a spaced pair of interconnects. A high temperature CVD dielectric is then deposited upon and between the pair of interconnects, followed by a low temperature CVD dielectric deposited upon and between the pair of interconnects. The low temperature is of magnitude less than the high temperature.

The present invention further contemplates a method for forming an air gap between integrated circuit interconnects. The method includes the steps for depositing a first dielectric upon a semiconductor topography. A hygroscopic dielectric is then deposited upon the first dielectric, followed by a second dielectric deposited upon the hygroscopic dielectric. A conductive layer is deposited upon the second dielectric, and then the conductive layer, second dielectric, and at least a partial thickness of the hygroscopic dielectric is removed in select regions across the semiconductor topography. The resulting topography thereby includes a spaced set of interconnects. A third dielectric is deposited upon and between the interconnects at a temperature sufficient to outgas moisture from the exposed hygroscopic dielectric. Outgasing of the hygroscopic dielectric prevents substantial adhesion and accumulation of the third dielectric upon the hygroscopic dielectric surface. A fourth dielectric is preferably deposited at a temperature sufficient to cap the keyhole formed by the deposited third dielectric. The capped keyhole comprises an air gap or void encompassed completely within the third and fourth dielectrics.

According to one embodiment, the semiconductor topography comprises a silicon substrate or a layer of dielectric placed upon a layer of patterned interconnects. According to one embodiment, the hygroscopic dielectric comprises a spin on glass (SOG) or a polyimide. According to one embodiment, the hygroscopic dielectric is either partially or entirely removed in the select regions. The air gap comprises a chamber encompassed by the deposited dielectric. The chamber extends a vertical distance which extends beyond the thickness of the integrated circuit interconnect. Accordingly, the air gap extends along a vertical midline which separates the spaced interconnects, and the air gap extends from a plane below the spaced interconnects to a plane above the spaced interconnects. The air gap completely separates the interconnects to reduce the permittivity of the overall dielectric structure arranged directly between the interconnects.

BRIEF DESCRIPTION OF THE DRAWINGS

Other objects and advantages of the invention will become apparent upon reading the following detailed description and upon reference to the accompanying drawings in which.

Figure 1:
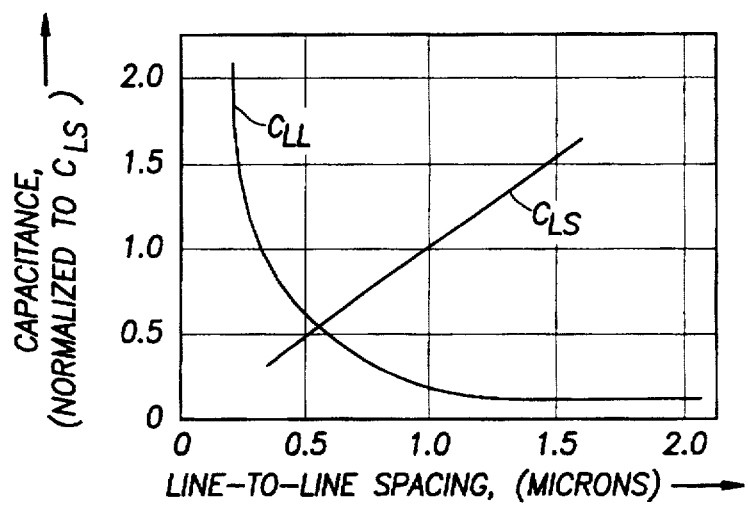
FIG. 1 is a graph of conductor-to-conductor as well as conductor-to-substrate capacitance plotted as a function of line spacing.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 2:
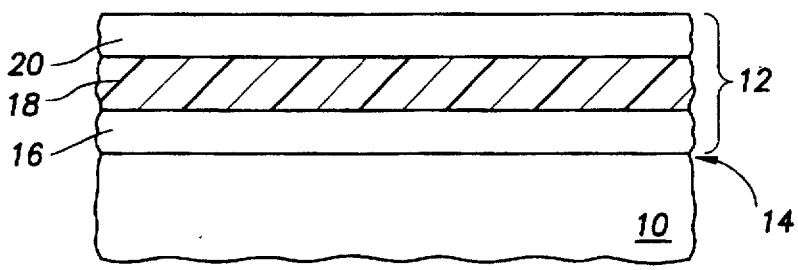
FIG. 2 is a partial cross-sectional view of an integrated circuit topography having a sandwich structure deposited thereon, the sandwich structure comprises a layer of hygroscopic dielectric interposed between a pair of substantially non-dielectric layers.

Turning now to drawings, FIG. 2 illustrates, in partial cross-section, a semiconductor topography 10. Placed upon semiconductor topography 10 are a series of insulative layers, referred to as a sandwich structure 12. Semiconductor topography includes an upper surface 14 which comprises either the upper surface of a semiconductor substrate or a dielectric fashioned upon a layer of printed conductors. In the latter instance, sandwich structure 12 comprises an interlevel dielectric placed between two levels of interconnect.

Sandwich structure 12 comprises a first dielectric layer 16 preferably deposited from a chemical vapor deposition (CVD) processes. First dielectric 16 is preferably a silicon dioxide (oxide) formed from either a silane or TEOS source. Addition of boron or phosphorus to the oxide can be used to help reduce mechanical stress within the resulting film. Placed upon first dielectric 16 is a hygroscopic dielectric 18. Hygroscopic dielectric 18 can be deposited using the same techniques as those for first dielectric 16 or, can be preferably deposited using spin-on techniques. Hygroscopic dielectric 18 is a dielectric which readily absorbs water and therefore is less dense than first dielectric 16. Dielectric 18 advantageously planarizes localized areas, and can fill small openings of high aspect ratio. Dielectric 18 includes any material which is hygroscopic, such as a polyimide, siloxane, or silicate. The hygroscopic nature of polyimide or silicate is due primarily to its liquid form, when deposited. The polyimide is deposited with a polyamic-acid precursor, whereas siloxane or silicates are mixed in an alcohol-based solvent. When cured, the liquid component is driven off, leaving a material which readily absorbs water.

Placed upon hygroscopic dielectric 18 is a second dielectric layer 20. Second dielectric 20 is preferably similar in composition to first dielectric 16, and does not contain the hygroscopic features of dielectric 18. The overall thicknesses of layers 16, 18 and 20 vary depending upon the amount of conformality needed for layers 16 and 20, and the amount of planarization needed for layer 18. The overall thickness of sandwich structure 12, however, is maintained sufficient to prevent coupling between a level of interconnect within topography 10 and an interconnect level deposited upon sandwich structure 12.

Figure 3:
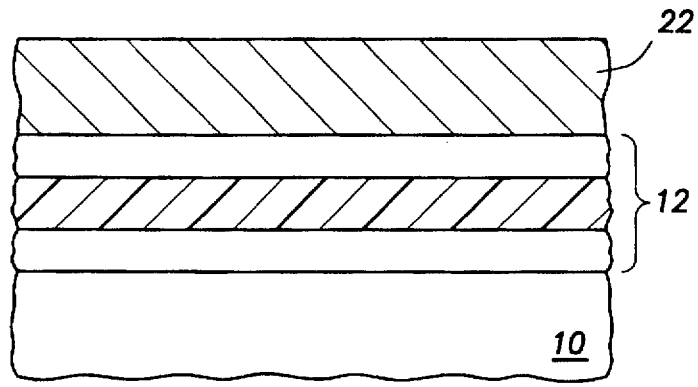
FIG. 3 illustrates a processing step subsequent to that shown in FIG. 2, whereby a conductive layer is deposited upon the sandwich structure.

Turning now to FIG. 3, a processing step subsequent to that of FIG. 2 is shown. A conductive layer 22 is illustrated deposited upon sandwich structure 12. Conductive layer 22 includes any material having conductive properties such as, for example, refractory metals or polysilicon. Conductive layer 22 is preferably deposited using a sputter deposition apparatus, wherein the sputter target contains the conductive material.

Figure 4:
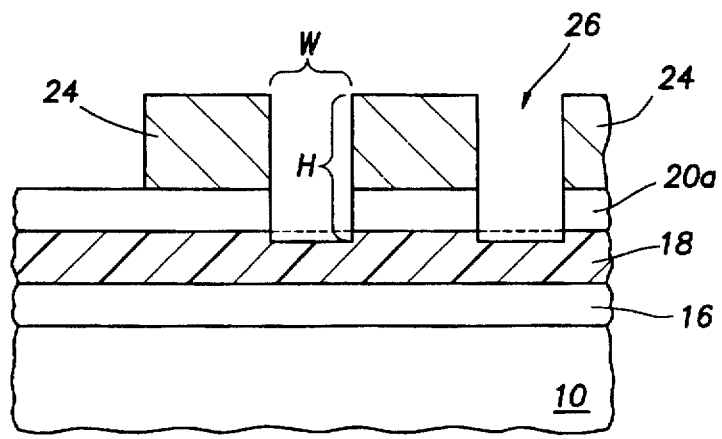
FIG. 4 illustrates a processing step subsequent to that shown in FIG. 3, whereby select regions of the conductive layer and the sandwich structure are removed to form a spaced set of interconnects.

FIG. 4 illustrates removal of conductive layer 22, second dielectric 20, and at least a portion of hygroscopic dielectric 18 from select regions across semiconductor topography 10. Select removal is carried out using lithography steps. The etch material, either wet etch or plasma etch, is chosen to selectively remove each layer, one at a time. By removing certain regions of conductive layer 22 and second dielectric 20, a set of interconnects 24 are produced. The interconnects 24 are shown elevated above hygroscopic dielectric 18 by a patterned second dielectric 20A.

Based upon the etch region, interconnects 24 are spaced from each other by a width W. The amount by which the upper surface of interconnects 24 extend above the lower surface of the etch region is defined as height H. Accordingly, aspect ratio is defined herein as a ratio of H to W. Aspect ratio is accordingly designed having dimension H greater than W, preferably, dimension H is more than twice W so as to produce an aspect ratio of 2.0 or more. The aspect ratio is controlled by varying the thickness of second dielectric 20 and/or varying the amount of hygroscopic dielectric 18 removed from region 26. Removing a larger amount of hygroscopic dielectric 18 thickness causes dimension H to increase, and aspect ratio to also increase. Adjustment of aspect ratio is made by varying the amount of etch within hygroscopic dielectric 18.

Figure 5:
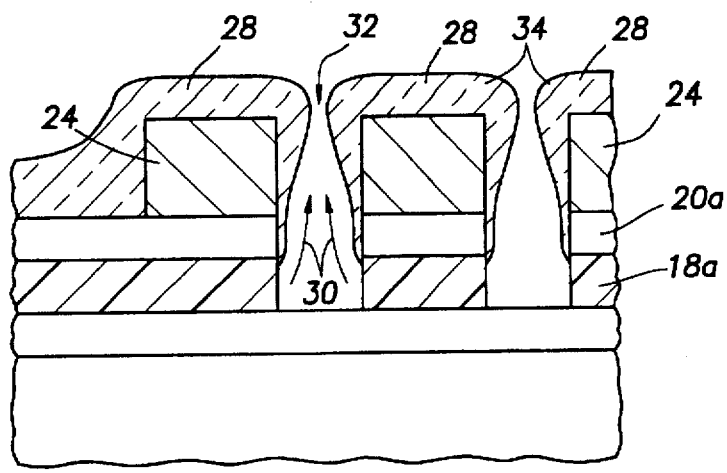
FIG. 5 illustrates a processing step subsequent to that shown in FIG. 4, whereby a high temperature fill dielectric is deposited on and between the spaced set of interconnects.

Referring now to FIG. 5, a high temperature fill dielectric 28 is deposited upon and between the spaced set of interconnects 24. Dielectric 28 is preferably CVD deposited either from a high temperature CVD process, or a low temperature CVD process followed by a high temperature cure. The high temperature CVD process is defined as having a temperature exceeding, for example, 500° C. The high temperature process is generally performed using standard chemical vapor deposition (CVD) or low pressure CVD (LPCVD) techniques. Dielectric 28 includes any material of insulated characteristics, including oxide, nitride, and/or oxynitride.

FIG. 5 illustrates, according to one embodiment, complete etch through hygroscopic dielectric 18 prior to the deposition of high temperature fill dielectric 28. Depending upon the desired aspect ratio, hygroscopic dielectric 18 can be etched slightly into its upper surface, further into its upper surface, or entirely through its entire thickness. The chosen temperature at which dielectric 28 is deposited allows for outgasing (or desorption) of moisture from hygroscopic dielectric 18 during the deposition stage. Accordingly, outgasing minimizes or substantially prevents deposition and accumulation of dielectric 28 upon the etch surface of hygroscopic dielectric 18 or the sidewalls of patterned hygroscopic dielectric 18a. Arrows 30 indicate the direction at which outgasing molecules, such as hydrogen, oxygen, etc. expel from the desorbed hygroscopic dielectric layer 18. Desorption, or outgasing, occurs during deposition of dielectric 28. Accordingly, dielectric 28 may not, in all instances, join at midline 32 directly between pile up locations 34. Accordingly, FIG. 6 illustrates the possibility of requiring another deposition cycle.

Figure 6:
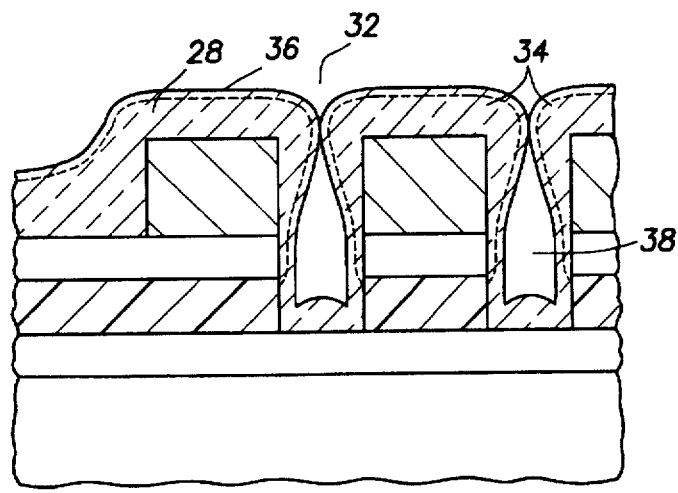
FIG. 6 illustrates a processing step subsequent to that shown in FIG. 5, whereby a low temperature fill dielectric is deposited upon and between the spaced set of interconnects and, more specifically, is deposited upon the high temperature fill dielectric in the spaces between the spaced set of interconnects.

FIG. 6 illustrates, in a step subsequent to that shown in FIG. 5, deposition of a low temperature fill dielectric 36. Fill dielectric 36 is deposited upon fill dielectric 28, and especially upon the upper surface or sidewalls of hygroscopic or patterned hygroscopic dielectric 18 or 18a, respectively. Reference 18a denotes separation of, or complete etch through, non-separated dielectric 18. FIG. 4 illustrates non-separated dielectric 18 and, according to another embodiment, FIG. 4 illustrates separated dielectric 18a. Fill dielectric 36 also allows fill or joinder at midline 32 between pile up locations 34. Fill dielectric 36 is deposited at lower temperatures than that of fill dielectric 28. More specifically, fill dielectric 36 is deposited at temperatures less than 400° C. The combination of the pre-existing high temperature fill dielectric 28, and subsequent low temperature fill dielectric 36 allows dielectric 36 to adhere and accumulate upon hygroscopic material 18 due primarily to the lessened outgasing of that material during the low temperature fill dielectric deposition cycle. More specifically, the lower temperature fill dielectric does not trigger sufficient amounts of outgasing necessary to overcome deposition upon the outgasing material or within the outgas channel. By selecting the low temperature fill dielectric process to a temperature which allows deposition to overcome outgasing, an air gap 38 is achieved, wherein air gap 38 is completely encased within high and/or low temperature fill dielectrics 28 and 36.

Air gaps 38 are formed uniformly between certain interconnects 24. More specifically, air gaps are formed in spacing regions which have an aspect ratio exceeding 1.0, and preferably exceeding 2.0. Air gaps 38 are initiated during the deposition of fill dielectric 28, and completed during deposition of fill dielectric 36. Fill dielectric 36 is deposited at low temperatures using, for example, any of the lower temperature CVD processes, including plasma enhanced CVD (PECVD). It is preferred that fill dielectrics 28 and 36 not be formed from an ozone-based source, or a combination of ozone and TEOS sources. Fill dielectrics 28 and 36 also cannot be formed from a spin-on glass (SOG) material. Fill dielectrics 28 and 36 can, however, be formed from a nitride source materials such that the resulting material comprises an oxynitride, or layered composite of oxide/nitride/oxide. If fill dielectrics 28 or 36 comprises an oxide, the oxide can encompass phosphorus doping to enhance its cusping and void formation effects. Accordingly, instead of trying to avoid voids or air gaps as in conventional art, the present process purposely chooses a deposition material and process which ensures initial stages of a void during deposition of dielectric 28 followed by complete enclosure of that void during deposition of dielectric 36.

Figure 7:
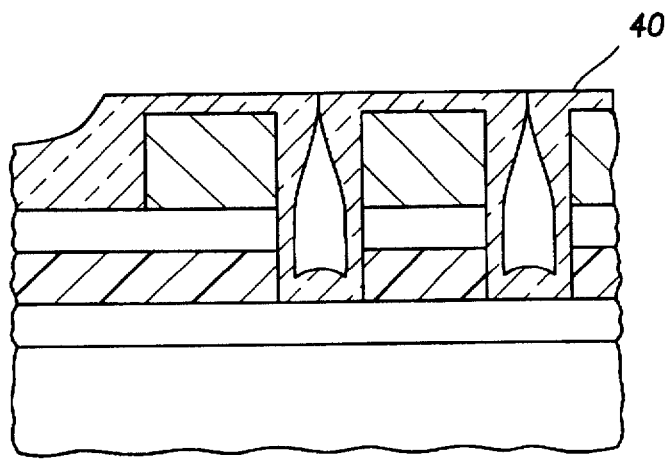
FIG. 7 illustrates a processing step subsequent to that shown in FIG. 6, whereby the high temperature and low temperature fill dielectrics are substantially planarized in readiness of an overlying layer of conductors.

Turning now to FIG. 7, a processing step subsequent to FIG. 6 is shown. A planarization step is illustrated, wherein the upper surface of fill dielectrics 28 and 36 are removed, either by an etch back process or a chemical mechanical polish (CMP). Etch back is achieved by depositing, for example, a planarization layer with similar etch characteristics to that of fill dielectrics 28 and 36. The planarization layer and underlying surface is then blanket etched to produce a planarized surface 40.

Figure 8:
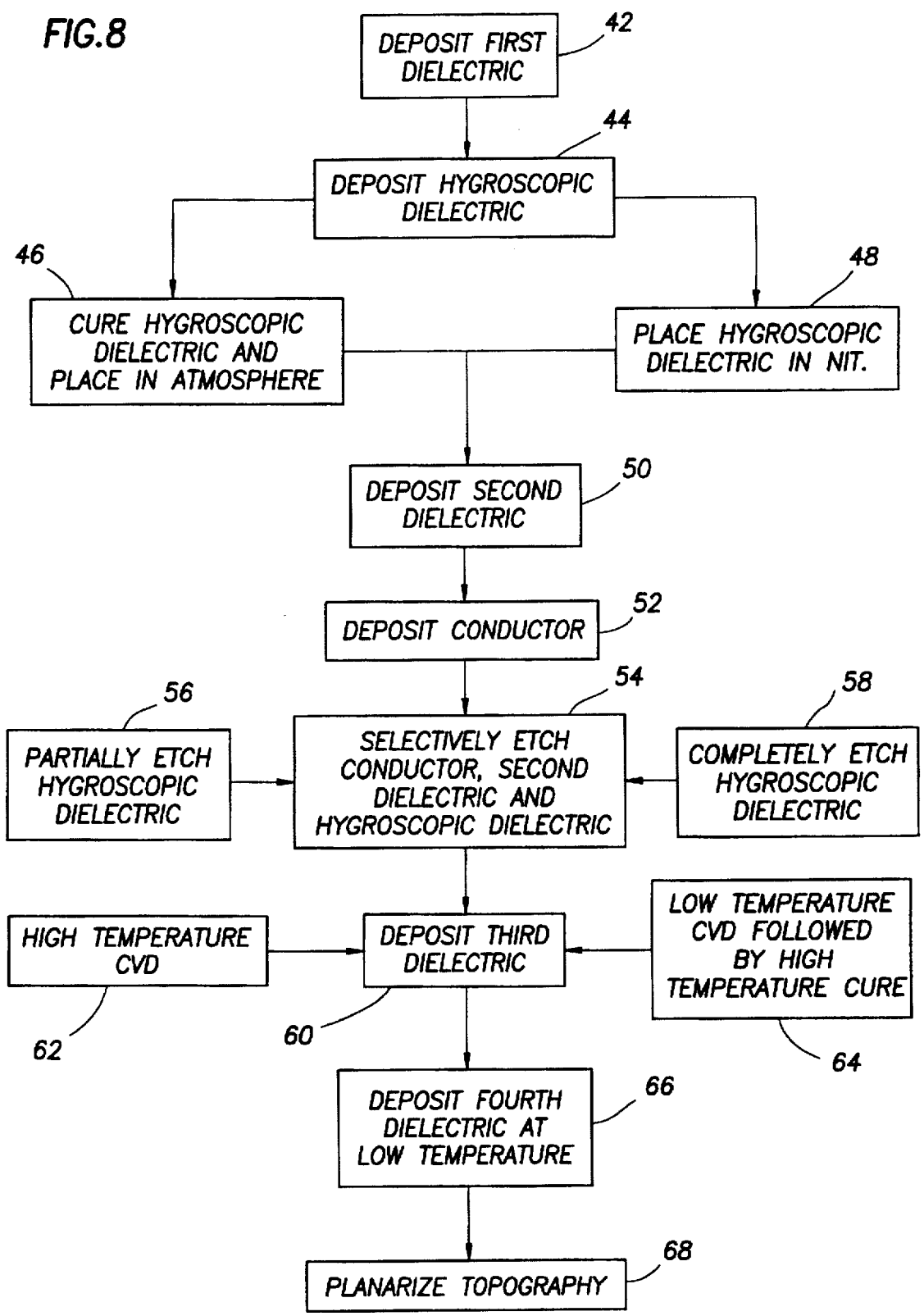
FIG. 8 is a processing flow diagram of several embodiments used in producing an air gap within dielectric material deposited between semiconductor interconnect lines.

Turning now to the flow diagram of FIG. 8, a processing sequence for producing air gaps 38 between interconnects is shown. Step 42 illustrates deposition of a first dielectric 16 upon semiconductor topography 10. Thereafter, hygroscopic dielectric 18 is deposited upon first dielectric 16, as shown by reference numeral 44. Hyroscopic dielectric 18 can be cured, according to one embodiment, by exposing it to a high temperature cycle and thereafter placing it in an oxygen and/or hydrogen atmosphere, as shown by reference numeral 46. Alternatively, hygroscopic layer 18 is maintained in a nitrogen environment, as shown by reference numeral 48. Step 48 allows more moisture within hygroscopic dielectric to be maintained, and therefore preconditions the hygroscopic dielectric to achieve a greater outgasing magnitude. On the other hand, step 46 desorbs most of the hygroscopic properties but thereafter subjects the hygroscopic material to an absorbing atmosphere. In either instance, the resulting hygroscopic material maintains an attraction to moisture.

In step 50, second dielectric 20 is deposited upon hygroscopic dielectric 18 to complete the sandwich structure 12. Deposited upon the sandwich structure, and upon second dielectric 20 is a conductive layer 22, as shown in step 52. Select regions of conductor 22, second dielectric 20 and at least a portion of the underlying hygroscopic dielectric 18 are removed in step 54. According to alternative embodiments, only a portion of the thickness of hygroscopic dielectric 18 is removed, or the entire thickness of hygroscopic dielectric is removed, as shown in steps 56 and 58, respectively. Once the spaced interconnect is formed, a third dielectric (high temperature fill dielectric 28) is deposited thereon, as shown by reference numeral 60. High temperature fill dielectric 28 is either deposited from a high temperature CVD chamber, or a low temperature CVD chamber followed by a high temperature cure, as shown by reference numerals 62 and 64 respectively. High temperature CVD is defined above as a deposition processing in which a deposition temperature exceeds 500° C. The dielectric can be deposited below 500° C., but as shown by step 64, low temperature CVD is followed by a high temperature (500° C. or more) curing cycle.

Deposited upon third dielectric (high temperature fill dielectric 28) is a fourth dielectric (low temperature fill dielectric 36). The deposition of fourth dielectric is shown by reference numeral 66. Third and fourth dielectrics allow formation of an air gap near the midline between interconnects. The air gap is completely encompassed within the third and/or fourth dielectrics, and is caused by a combination of aspect ratio resulting from hygroscopic dielectric removal and outgasing caused by the exposure of hygroscopic dielectric. The third dielectric forms a keyhole, and the fourth dielectric covers that keyhole to form the air gap. The capped keyhole (or air gap) resides beneath the resulting dielectric upper surface such that the upper surface can be planarized in a subsequent step shown as reference numeral 68. Accordingly, the first through fourth dielectrics and the hygroscopic dielectric form an interlevel dielectric structure configured between two levels of interconnect, or between an interconnect and an underlying substrate. The air gaps formed as the interlevel dielectric optimally resides at a midline between certain interconnects. Each air gap extends vertically from an elevation level below the lower regions of these spaced interconnect to an elevation above the upper regions of spaced interconnect. Accordingly, the lower permittivity enjoyed by air exists across the entire cross-section between interconnects. This advantage renders an overall lowering of permittivity between the interconnects and thereby reduces line-to-line capacitance and propagation delay.

It would be appreciated to those skilled in the art having the benefit of this disclosure that this invention is capable of applications with numerous types of MOS-processed circuits. Furthermore, it is to be understood that the form of the invention shown and described is to be taken as presently preferred embodiments. Various modifications and changes may be made to each and every processing step as would be obvious to a person skilled in the art having the benefit of this disclosure. Provided the spacing area is properly configured, and provided the high and low temperature fill dielectrics are formed so as to form a keyhole and subsequent void between closely spaced interconnects, various deposition techniques and deposition processes can be used. Thus, the purpose hereof is to form a reentrant angle near the midline between the interconnects during the cumulative deposition of dielectric material comprising the high and low temperature fill dielectrics (i.e., third and fourth dielectrics). It is intended that the following claims be interpreted to embrace all such modifications and changes and, accordingly, the specification and drawings are regarded in an illustrative rather than a restrictive sense.

What is claimed is:

1. A method for forming an air gap between a pair of integrated circuit interconnects, comprising:
   providing a semiconductor topography;
   depositing a sandwich structure upon said semiconductor topography, said sandwich structure comprises a layer of hygroscopic dielectric interposed between a pair of dielectric layers;
   depositing a conductive layer upon said sandwich structure;
   removing said conductive layer, one of said pair of dielectric layers, and at least a portion of said hygroscopic dielectric to form a spaced pair of interconnects;
   depositing a high temperature fill dielectric partially upon and between said pair of interconnects to form an opening directed into a cavity between the dielectric coated pair of interconnect; and
   depositing a low temperature fill dielectric upon and between said pair of interconnects to fill said opening and seal said cavity to form said air gap.

2. The method as recited in claim 1, wherein said semiconductor topography comprises a silicon substrate.

3. The method as recited in claim 1, wherein said semiconductor topography comprises a layer of dielectric upon a layer of patterned interconnects.

4. The method as recited in claim 1, wherein the step of depositing a conductive layer comprises sputter depositing a layer of refractory metal.

5. The method as recited in claim 1, wherein the step of removing the hygroscopic dielectric comprises entirely removing said hygroscopic dielectric in said select regions.

6. The method as recited in claim 1, wherein said hygroscopic dielectric comprises spin on glass.

7. The method as recited in claim 1, wherein said hygroscopic dielectric comprises polyimide.

8. The method as recited in claim 1, wherein the step of depositing a high temperature fill dielectric comprises depositing an oxide from a silane source and at a temperature exceeding 500° C.

9. The method as recited in claim 1, wherein the step of depositing a high temperature fill dielectric comprises:
   depositing an oxide from a silane source and at a temperature less than 400° C.; and further comprises:
   exposing said semiconductor topography to a temperature exceeding 500° C.

10. The method as recited in claim 1, wherein the step of depositing a low temperature fill dielectric comprises depositing an oxide from a silane source and at a temperature less than 400° C.

11. A method for forming an air gap between a pair of integrated circuit interconnects, comprising:
    depositing a first dielectric upon a semiconductor topography;
    depositing a hygroscopic dielectric upon said first dielectric;
    depositing a second dielectric upon said hygroscopic dielectric;
    depositing a conductive layer upon said second dielectric;
    removing regions of said conductive layer, said second dielectric, and at least a partial thickness of said hygroscopic dielectric to form the pair of interconnects;
    depositing a third dielectric upon and between the interconnects at a temperature sufficient to outgas moisture from said hygroscopic dielectric and prevent substantial adhesion and accumulation of said third dielectric upon said hygroscopic dielectric, wherein the depositing is carried out at a temperature which produces sufficient outgassing of the hygroscopic dielectric as to substantially prevent deposition of the third dielectric on the hygroscopic dielectric, and wherein the thickness of said third dielectric increases with elevation above the semiconductor topography such that a cavity is formed between said pair of interconnects, and wherein an opening to said cavity exists between the pair of interconnects; and
    depositing a fourth dielectric at a temperature sufficient to fill said opening sealing said cavity and forming an air gap between said pair of interconnects.

12. The method as recited in claim 11, wherein the step of removing the hygroscopic dielectric comprises entirely removing said hygroscopic dielectric in said select regions.

13. The method as recited in claim 11, wherein said hygroscopic dielectric comprises spin on glass.

14. The method as recited in claim 11, wherein said hygroscopic dielectric comprises polyimide.

15. The method as recited in claim 11, wherein said air gap comprises a chamber encompassed within said fourth dielectric and extending vertically a spaced distance above said hygroscopic dielectric to an elevational level above a plane formed by upper surfaces of said integrated circuit interconnects.

16. The method as recited in claim 11, wherein the step of removing comprises forming a space between the pair of interconnects which is of lesser distance than a thickness of said conductive layer combined with said at least partial thickness of said hygroscopic dielectric.

17. The method as recited in claim 11, wherein the step of depositing a fourth dielectric comprises depositing said fourth dielectric upon said hygroscopic dielectric to a thickness less than a combined thickness of said conductive layer and said second dielectric.

* * * * *